(12) United States Patent
Lyu

(10) Patent No.: US 6,746,959 B2
(45) Date of Patent: *Jun. 8, 2004

(54) LIQUID CRYSTAL DISPLAY AND METHOD

(75) Inventor: Ki-Hyun Lyu, Kyungki-do (KR)

(73) Assignee: LG Philips LCD Co., Ltd., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 43 days.

(21) Appl. No.: 09/413,854

(22) Filed: Oct. 7, 1999

(65) Prior Publication Data

US 2002/0037646 A1 Mar. 28, 2002

Related U.S. Application Data

(62) Division of application No. 08/799,389, filed on Feb. 11, 1997.

(30) Foreign Application Priority Data

Jul. 26, 1996 (KR) .............................................. 96-10637

(51) Int. Cl.⁷ ................................................ H01L 21/20
(52) U.S. Cl. ...................... 438/689; 438/700; 438/706; 438/745
(58) Field of Search ................................ 438/689, 700, 438/706, 745

(56) References Cited

U.S. PATENT DOCUMENTS

| | | | |
|---|---|---|---|
| 4,951,113 A | 8/1990 | Huang et al. ................. | 257/72 |
| 5,084,905 A | 1/1992 | Sasaki et al. | |
| 5,202,572 A | 4/1993 | Kobayashi .................... | 257/60 |
| 5,274,250 A | 12/1993 | Miyake et al. ................. | 257/59 |
| 5,294,811 A | 3/1994 | Aoyama et al. | |
| 5,327,001 A | 7/1994 | Wakai et al. ................ | 257/350 |
| 5,349,205 A | 9/1994 | Kobayashi et al. | |
| 5,362,661 A * | 11/1994 | Kim ............................ | 437/40 |
| 5,367,180 A | 11/1994 | Asai et al. ..................... | 257/66 |
| 5,371,398 A | 12/1994 | Nishihara .................... | 257/435 |
| 5,380,673 A * | 1/1995 | Yang et al. .................... | 437/47 |
| 5,466,620 A * | 11/1995 | Bang ............................ | 437/51 |
| 5,471,330 A * | 11/1995 | Sarma ......................... | 359/59 |
| 5,530,290 A * | 6/1996 | Aitken et al. ................ | 257/758 |
| 5,539,219 A | 7/1996 | den Boer et al. | |
| 5,614,731 A | 3/1997 | Uchikoga et al. ............. | 257/59 |
| 5,616,932 A | 4/1997 | Sano et al. .................... | 257/52 |
| 5,641,974 A | 6/1997 | den Boer et al. ............. | 257/59 |
| 5,751,020 A * | 5/1998 | Lyu .............................. | 257/72 |
| 5,811,836 A * | 9/1998 | Ha ................................ | 257/59 |
| 5,903,326 A * | 5/1999 | Suman et al. .................. | 349/2 |
| 6,001,539 A * | 12/1999 | Lyu et al. .................... | 430/317 |
| 6,083,779 A * | 7/2000 | Seo .............................. | 438/158 |
| 6,091,465 A * | 7/2000 | Lyu .............................. | 349/43 |

* cited by examiner

Primary Examiner—Robert Kunemund
(74) Attorney, Agent, or Firm—Finnegan, Henderson, Farabow, Garrett, & Dunner, L.L.P.

(57) ABSTRACT

The number of mask steps used to fabricate a TFT in an AMLCD is reduced. In particular, source and drain metallizations, as well as doped and undoped semiconductor layers are patterned at the same time, and the source and drain metallizations and the doped semiconductor layer are etched in a single etching step using an insulating passivation layer as a mask to form source and drain electrodes. Manufacturing costs can be reduced and the manufacturing yield can be improved.

17 Claims, 7 Drawing Sheets

LIQUID CRYSTAL DISPLAY AND METHOD

This is a division of application Ser. No. 08/799,389, filed Feb. 11, 1997.

BACKGROUND OF THE INVENTION

1. Filed of the Invention

The present invention relates to a method for manufacturing active matrix liquid crystal displays ("AMLCD"), and to the structure of AMLCDs manufactured by such a method.

2. Discussion of the Related Art

AMLCDs comprise active elements such as thin film transistors ("TFT") as switching devices for driving and controlling each pixel of the display.

As shown in FIG. 1A, in a conventional AMLCD including an array of TFTs, substantially rectangular pixel electrodes 47 are closely arranged in rows and columns on a transparent glass substrate. Gate bus lines (address lines) 13 are respectively formed closely along the rows of the pixel electrodes 47 and source bus lines (data lines) 14 are respectively formed closely along the columns of the pixel electrodes.

Referring to FIG. 1B, a plan view showing an enlargement of a single pixel of the AMLCD shown in FIG. 1A, gate bus lines 13 having gate electrode extensions 33 are formed on a transparent glass substrate 31 (FIG. 2A). An insulating layer 35 (FIG. 2B) covers the gate bus lines 13 and the gate electrodes 33, and a plurality of parallel source bus lines 14 are provided on the insulating layer extending perpendicular to gate bus lines 13. Near each gate bus line 13 and source bus line 14 intersection, a semiconductor layer 37 (FIG. 2B) is formed on the insulating layer covering the gate bus lines and the gate electrodes. Spaced source and drain electrodes, 43a and 43b respectively FIG. 2D), are formed opposite one another on the semiconductor layer. In this manner, TFTs as active elements are formed.

A manufacturing process of a conventional AMLCD is described below with reference to FIGS. 2A to 2E, showing cross-sectional views taken along a line 2—2 of FIG.

A gate electrode 33 (extension of a gate bus line 13) is formed on a transparent glass substrate 31 by depositing and patterning a first metal layer (FIG. 2A). A first insulating layer (a gate insulating layer) 35 made of $SiN_x$, a semiconductor layer 37 made of a-Si, and a second insulating layer made of $SiN_x$ are then successively deposited on the entire surface of the substrate.

As shown in FIG. 2B, an etch-stopper 40 is formed by patterning the second insulating layer, and an impurity doped semiconductor layer 39 including $n^+$ a-Si is then deposited over the entire substrate and patterned together with the semiconductor layer 37 (FIG. 2C).

A second metal layer 43 is next deposited on the entire surface of the substrate, which is then patterned to form a bus line, a source electrode 43a branching out from the source bus line, and a drain electrode 43b. Next, an exposed portion of the impurity doped semiconductor layer 39 is etched using the source and drain electrodes as masks, as shown in FIG. 2D.

An insulating passivation layer 45 is then formed by depositing another Si-nitride layer over the first insulating layer and the source and drain electrodes. Then a contact hole is formed by etching the insulating passivation layer 45. An ITO layer is sputter deposited on the insulating passivation layer 45. The ITO layer is patterned to form a pixel electrode 47, which is electrically connected to the drain electrode 43b through a contact hole (FIG. 2E).

This conventional process of manufacturing the TFTs is very complicated. Moreover, it takes a great deal of time to pattern the various layers of the AMLCD because the mask must be aligned precisely, and photo-resists must be coated and developed for each mask step. Further, the manufacturing yield is low.

SUMMARY OF THE INVENTION

The objective of the present invention is to provide a method for manufacturing AMLCDs, in which the number of mask steps is reduced by patterning a second metal layer and a semiconductor layer at the same time. Moreover, source and drain electrodes are formed by etching a portion of the second metal layer together with a portion of an impurity doped semiconductor layer using an insulating passivation layer as a mask.

In particular, the method according to the present invention comprises the following steps. A first metal layer is deposited on a transparent substrate, and gate bus lines and gate electrodes are formed by patterning the first metal layer. A first insulating layer, a semiconductor layer and a second insulating layer are sequentially deposited on the substrate on which the gate bus line and the gate electrode are formed. An etch-stopper is formed by patterning the second insulating layer, and an impurity-doped semiconductor layer is deposited on the etch-stopper and the semiconductor layer. A second metal layer is deposited on the impurity-doped semiconductor layer, and the second metal layer, the impurity-doped semiconductor layer and the semiconductor layer are patterned. An insulating passivation layer is deposited on the patterned second metal layer and the first insulating layer. A contact hole is then formed and a part of the second metal layer on the etch-stopper is exposed by patterning the insulating passivation layer. A transparent conductive layer is deposited on the insulating passivation layer and onto the exposed part of the second metal layer. A pixel electrode is formed by patterning the transparent conductive layer such that the pixel electrode is electrically connected with the second metal layer through a contact hole. Source and drain electrodes are formed by etching a part of the second metal layer and a part of the impurity-doped semiconductor layer, with the insulating passivation layer being used as a mask.

An AMLCD, according to the present invention, comprises a transparent glass substrate, gate bus lines and gate electrodes formed on the transparent glass substrate, a gate insulating layer formed on the transparent glass substrate on which the gate bus lines and the gate electrodes are formed, a semiconductor layer formed on the gate insulating layer, an etch-stopper formed on a portion of the semiconductor layer, an impurity-doped semiconductor layer formed on the semiconductor layer and separated into two parts on the etch-stopper, source and drain electrodes formed on each part of the separated impurity-doped semiconductor layer, respectively, an insulating passivation layer formed on the source and drain electrodes and having a contact hole, and a pixel electrode formed on a portion of the insulating passivation layer, the pixel electrode being electrically connected with the drain electrode through the contact hole.

DETAILED DESCRIPTION OF THE PREFERRED EMBODIMENT

The method for manufacturing AMLCDs according to the present invention will now be described below with reference to the drawings.

Figure 1A:
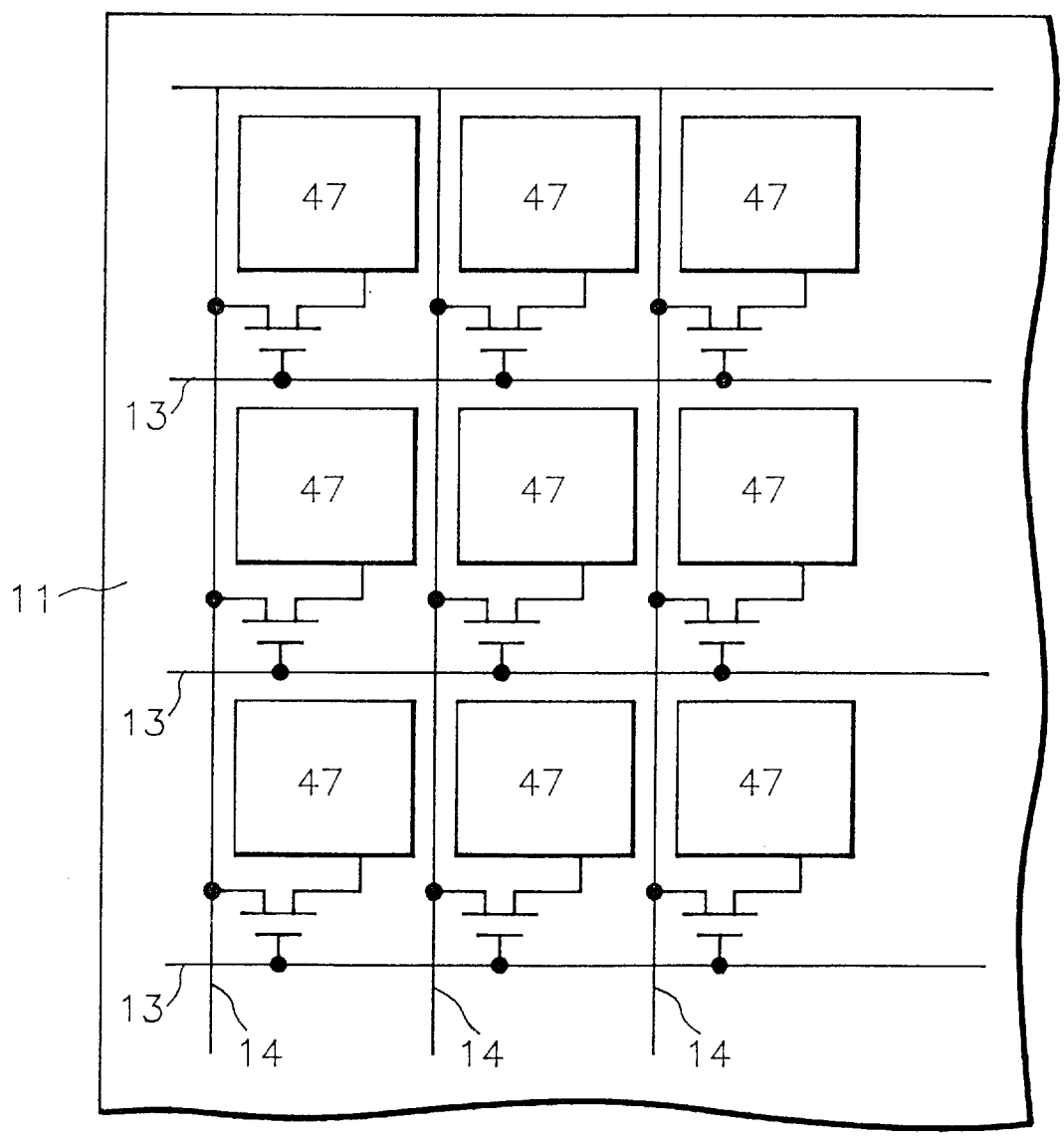
FIG. 1A is an overall plan view of a conventional LCD.
Figure 1B:
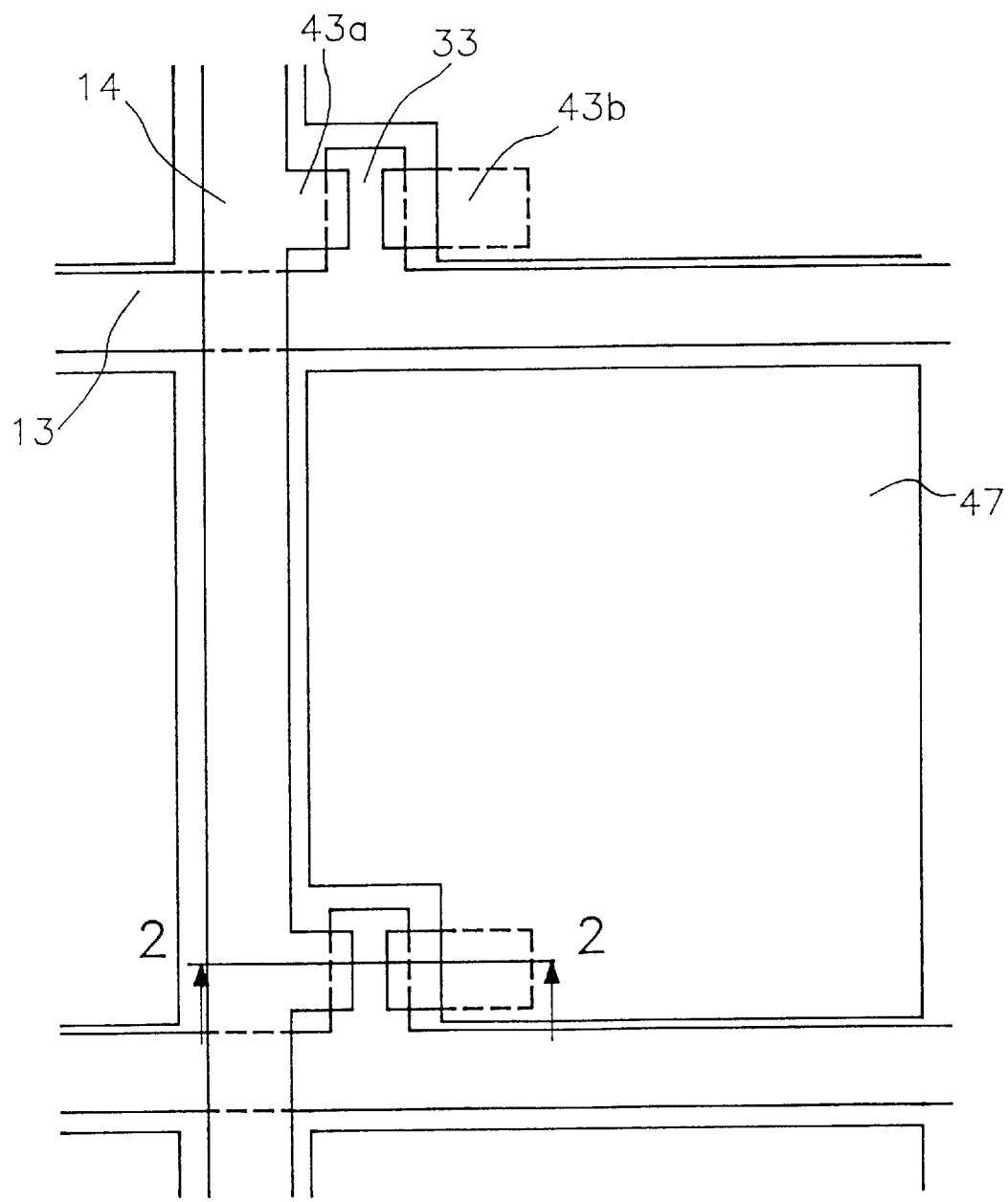
FIG. 1B is an enlarged plan view of one liquid crystal display element of the conventional LCD of FIG. 1.
Figure 2A:
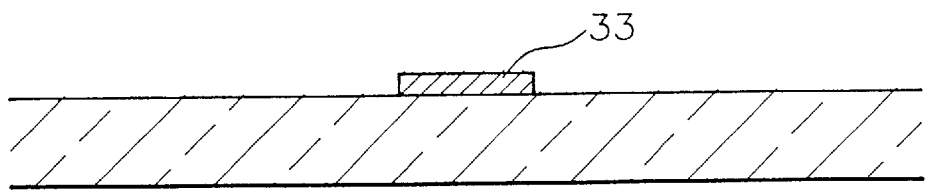
FIGS. 2A to 2E are cross-sectional views showing a conventional AMLCD at various states of a conventional manufacturing process.
Figure 2B:
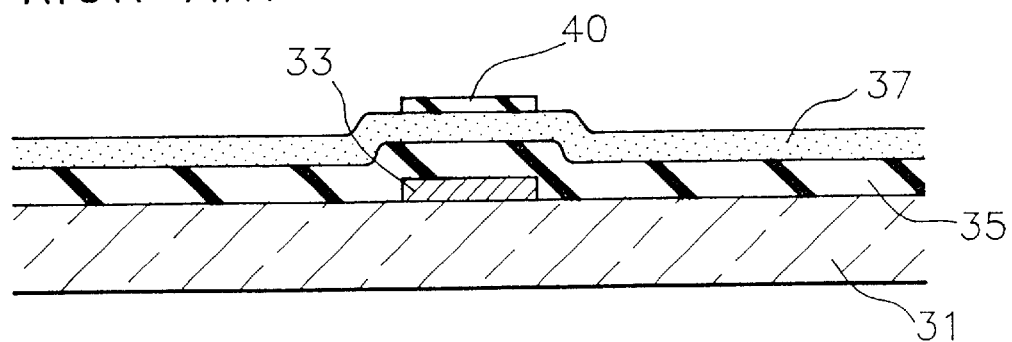
Figure 2C:
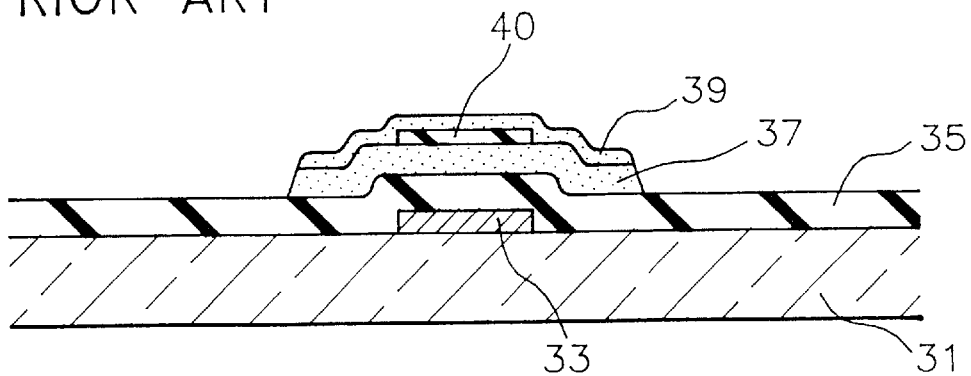
Figure 2D:
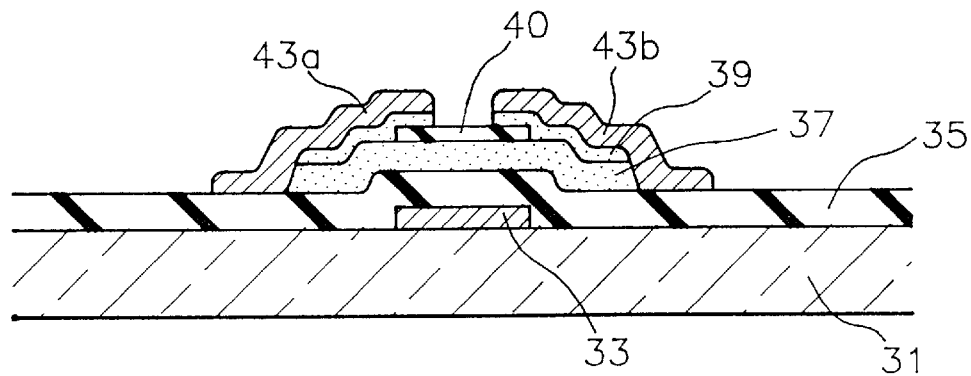
Figure 2E:
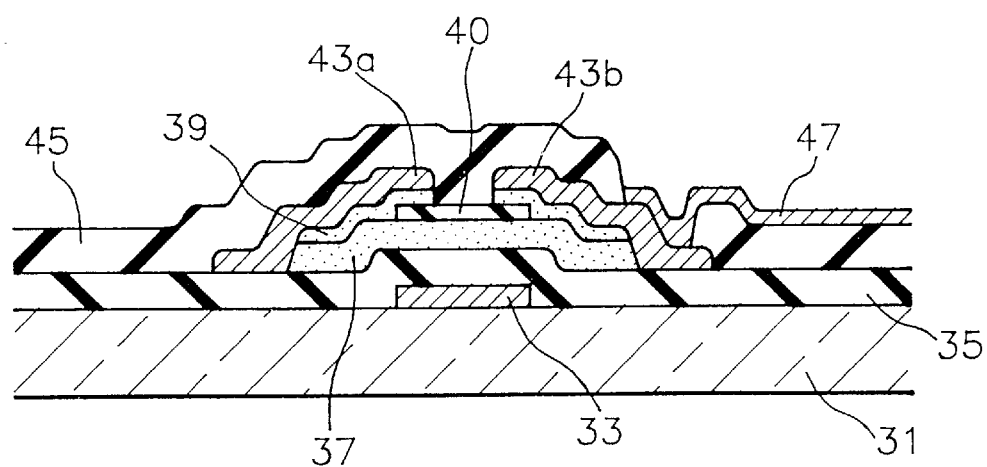
Figure 3A:
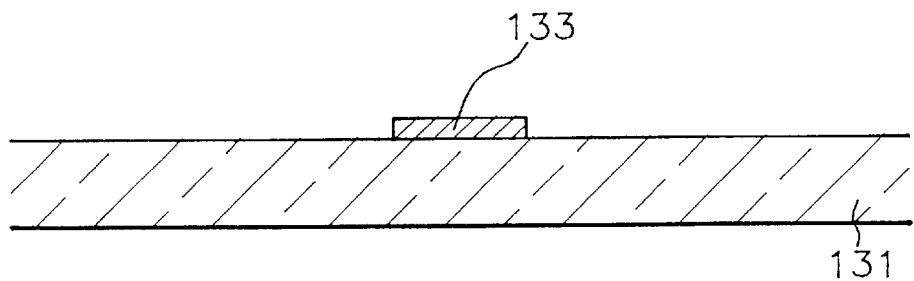
FIGS. 3A to 3I illustrate cross-sectional views of an AMLCD according to the present invention at various stages of a manufacturing process therefor, in accordance with the present invention.

A first metal layer of Al or Al alloy, such as Al—Pd, Al—Si, Al—Si—Ti, Al—Si—Cu, is preferably sputter deposited on a transparent glass substrate 131. A gate electrode 133 is then formed by selectively etching the first metal layer using a photo-lithography technique (FIG. 3A).

If necessary, an anodized layer may be formed on the gate electrode 133 by anodizing the gate electrode 133 in order to improve its chemical-resistance, heat-resistance and adhesiveness to a subsequently formed gate insulating layer. The anodized layer also functions as an insulating layer together with a Si-nitride gate insulating layer and therefore improves electrical isolation between the gate electrode 133 and an adjacent signal line.

Figure 3B:
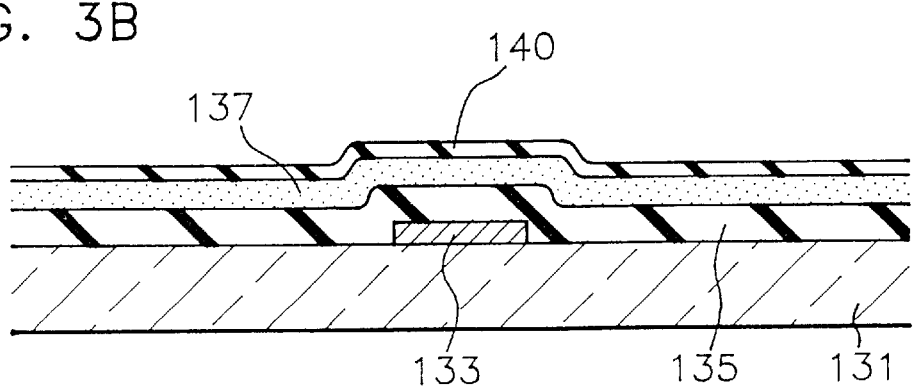

As shown in FIG. 3B, a first insulating layer (a gate insulating layer) 135, an undoped a-Si semiconductor layer 137, and a second insulating layer 140 of Si-nitride are successively deposited on transparent glass substrate 131.

Figure 3C:
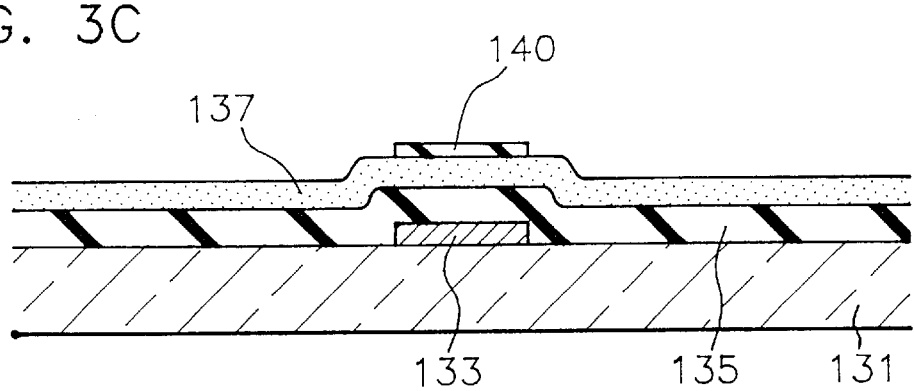
Figure 3D:
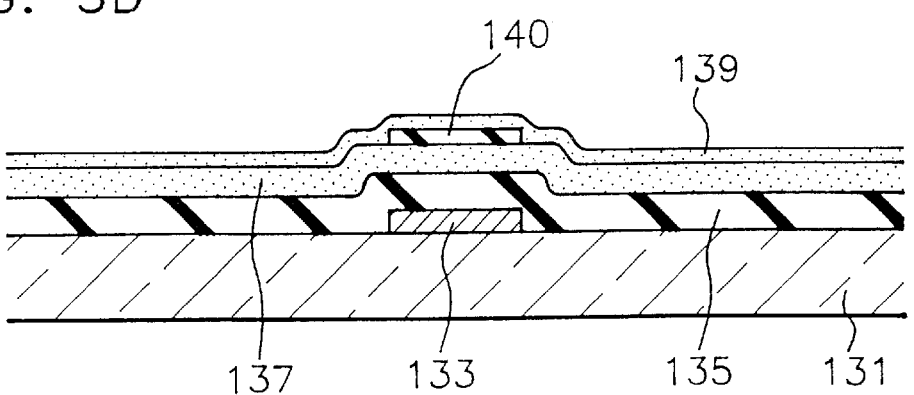

As seen in FIG. 3C, an etch-stopper 140 is then formed by patterning the second insulating layer, followed by deposition of a doped n$^+$ semiconductor layer 139 on the etch-stopper 140 and the semiconductor layer 137 by plasma CVD in an atmosphere of hydrogen and phosphine gases (FIG. 3D).

Figure 3E:
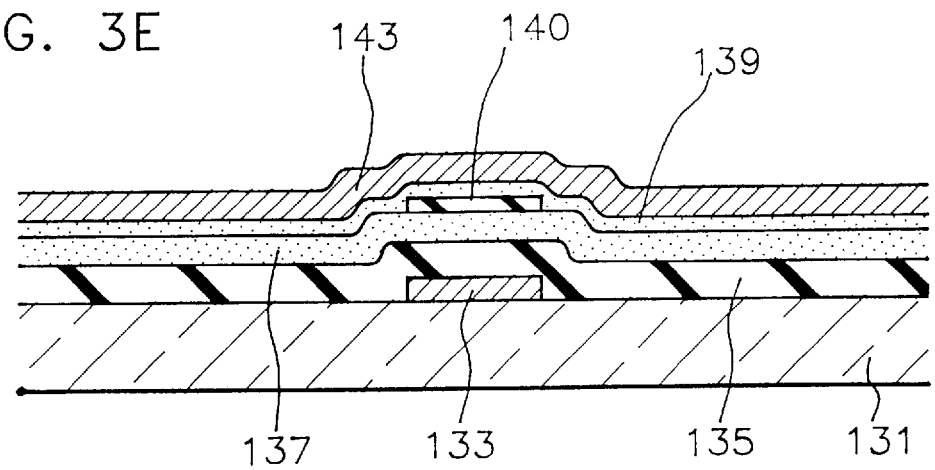
Figure 3F:
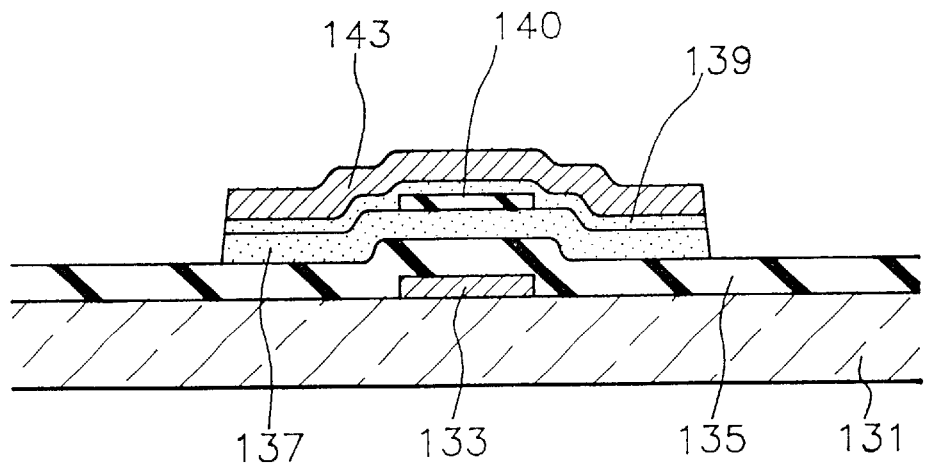

Next, as shown in FIG. 3E, a second metal layer 143, comprising one of Pd, Al—Si, Al—Si—Ti, and Al—Si—Cu, is sputter deposited, followed by depositing of a photosensitive layer. The photosensitive layer (not shown) is then exposed and developed to reveal selected portions of second metal layer 143. These portions are then removed, along with corresponding portions of the n$^-$ semiconductor layer 139 and semiconductor layer 137.Second metal layer 143, n$^-$ semiconductor layer 139, and semiconductor layer 137 are then patterned into a desired shape, as shown in FIG. 3F.

Figure 3G:
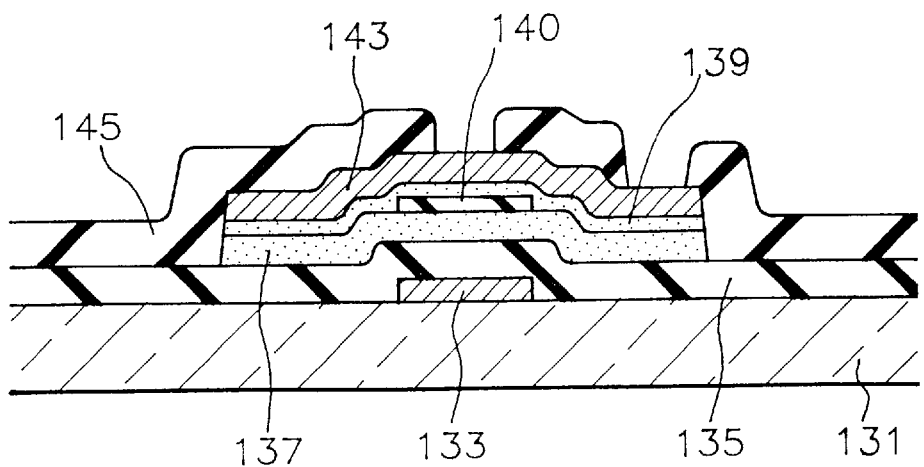

An insulating passivation layer 145 of Si-nitride is then deposited on the patterned second metal layer 143 and the gate insulating layer 135.by plasma CVD in an atmosphere of ammonia, silane, and hydrogen gases. Next, as shown in FIG. 3G, the insulating passivation layer is patterned to form an opening over etch-stopper 140 and a contact hole exposing a portion of second metal layer 143.

Figure 3H:
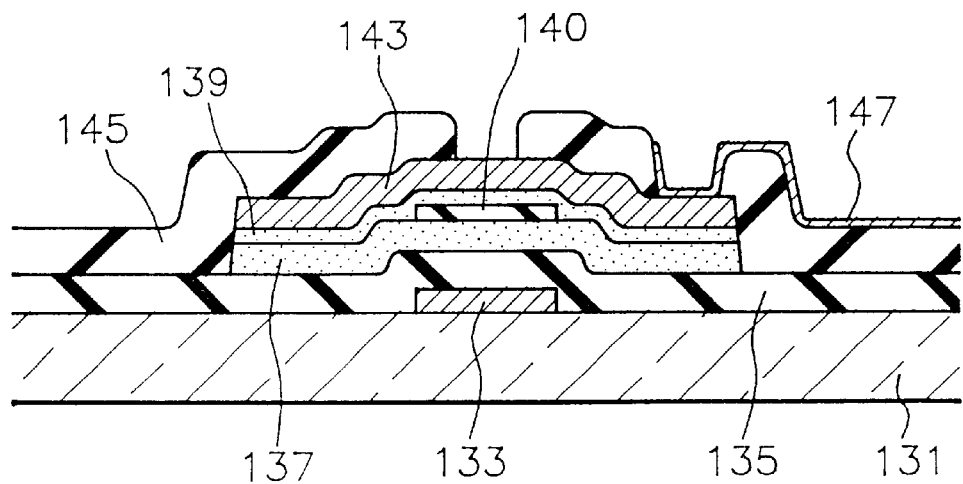
Figure 3I:
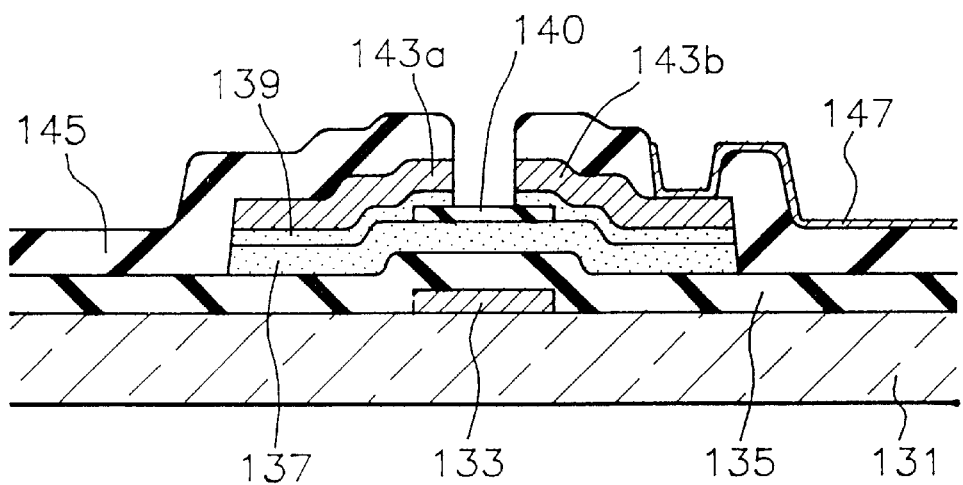

An ITO layer is deposited into the contact hole and on the insulating passivation layer 145 which is then patterned to form a pixel electrode 147 electrically connected with the second metal layer 143 through the contact hole as seen in FIG. 3H. As seen in FIG. 3I, source and drain electrodes, 143a and 143b, are next formed by etching the exposed portion of the second metal layer 143 and the n$^+$ semiconductor layer 139 using insulating passivation layer 145 as a mask. The reason of forming the pixel electrode 147 after etching the passivation layer 145 to form the opening an the contact hole and before etching the second metal layer 143 and n+ semiconductor layer 139 is that the pixel electrode 147 is protect the second metal layer 143 exposed through the contact hole to be etched. So, the sequence of manufacturing step is very important. Accordingly, second metal layer 143 and n$^+$ semiconductor layer 139 are etched in a single processing step. In contrast, in the conventional method described above, these layers overlying etch stopper 140 are etched respectively in separate steps.

The AMLCD manufactured by the above-described method has the structure described below. A gate bus line and a gate electrode 133 are formed on a transparent substrate 131. A gate insulating layer 135 covers the transparent glass substrate on which the gate bus line and the gate electrode 133 are formed. A semiconductor layer 137 is formed on the gate insulating layer 135, and an etch-stopper 140 is provided on the semiconductor layer 137 aligned with gate electrode 133. An impurity-doped n$^+$ semiconductor layer 139, includes two spaced portions, each of which overlaps etch-stopper 140 and semiconductor layer 137. The two spaced portion of n$^+$ semiconductor layer 139 has one part having a source electrode formed thereon and the other part having a drain electrode 143b formed thereon. An insulating passivation layer 145 covers the gate insulating layer, the source electrode 143a and the drain electrode 143b, and a pixel electrode on the insulating passivation layer is electrically connected with the drain electrode 143b through a contact hole formed in the insulating passivation layer.

Even though, the second insulating layer 140 may be not needed, in this case, the semiconductor layer 139 is exposed through the opening. So, the semiconductor layer 139 is not protected from the contacting materials thereon. Because the second insulating layer 140 made of silicon-oxide or silicon-nitride has a good adhesion with the semiconductor layer 139, it serves as etch stopper and passivation layer of semiconductor layer 139.

According to the present invention, the manufacturing cost is lowered and processing time is reduced because second metal layer 143 and impurity-doped semiconductor layer 139 and semiconductor layer 137 are patterned in the same step. Further, as recited above, source and drain regions are formed in a single processing step, without any additional mask steps. Yield is thus improved.

It well be apparent to those skilled in the art that various modifications and variations can be made in the AMLCD of the present invention and in construction of this AMLCD without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a semiconductor device comprising the steps of:

depositing a first semiconductor layer on a substrate;

depositing a second semiconductor layer on said first semiconductor layer;

depositing a conductive layer on said second semiconductor layer;

depositing a passivation layer on said conductive layer;

patterning said passivation layer to provide a plurality of openings exposing said conductive layer; and etching portions of said conductive layer and said second semiconductor layer in a single processing step using said patterned passivation layer as a mask.

2. A method in accordance with claim 1, further comprising the steps of depositing an etch resistant layer on said first semiconductor layer prior to said step of depositing said second semiconductor layer.

3. A method in accordance with claim 2, wherein said etch resistant layer remains substantially after said step of etching said conductive and semiconductor layers.

4. A method in accordance with claim 1, wherein said conductive layer is a second conductive layer, and prior to said step of depositing said first semiconductor layer, said method further comprising the step of:

depositing a first conductive layer on said substrate;

patterning said conductive layer to form a gate electrode; and depositing an insulating layer on said gate electrode.

5. A method in accordance with claim 1, wherein said second semiconductor layer is doped.

6. A method in accordance with claim 2, wherein said step of depositing said etch resistant layer includes the step of:

depositing an insulating layer on said semiconductor layer; and patterning said insulating layer to form said etch resistant layer.

7. A method in accordance with claim 1, wherein said patterning step includes the steps of forming a first opening and a second opening in said passivation layers, said portions of said conductive layer and said second semiconductor layer being etched through said first opening, said method further comprising the step of:

depositing an electrode layer on said passivation layer into said second opening such that said electrode layer is electrically connected to said conductive layer.

8. A method in accordance with claim 7, wherein said electrode comprises transparent conductive material.

9. A method in accordance with claim 8, wherein said electrode is a pixel electrode.

10. A method of fabricating a semiconductor device, comprising the steps of:

forming a semiconductor layer on a surface of a substrate;

forming a first conductive layer on said semiconductor layer;

forming a passivation layer on said first conductive layer;

patterning said passivation layer to provide first and second openings in said passivation layer to expose first and second portions, respectively, of said first conductive layer;

forming a second conductive layer on said passivation layer and extending through said first opening to contact said first conductive layer; and etching said second portion of said first conductive layer and a portion of said semiconductor layer underlying said second portion of said conductive layer in a single processing step using said patterned passivation layer as a mask.

11. A method in accordance with claim 10, wherein said etching step forms source and drain regions of said semiconductor device.

12. A method in accordance with claim 10, wherein prior to forming said semiconductor layer, said method further comprising the steps of forming an insulating layer on said substrate; and patterning said insulating layer to form an etch stop layer.

13. A method in accordance with claim 12, wherein said step of patterning said passivation layer includes a step of providing said second opening substantially aligned with said etch stop layer.

14. A method in accordance with claim 10, wherein said second conductive layer includes a transparent conductive layer.

15. A method in accordance with claim 10, wherein said semiconductor device is a thin film transistor.

16. A method of manufacturing an active matrix liquid crystal display, comprising the steps of:

depositing a first metal layer on a substrate;

patterning said first metal layer to form a gate electrode;

depositing a gate insulating layer on said substrate and said gate electrode;

depositing a first semiconductor layer on said gate insulating layer;

depositing an etch resistant layer on said first semiconductor layer;

patterning said etch resistant layer to form an etch stop portion;

depositing a second, impurity containing, semiconductor layer on said etch stop portion and said first semiconductor layer;

depositing a second metal layer on said impurity containing layer;

patterning said second metal layer; said second impurity containing semiconductor layer and said first semiconductor layer in a single step;

depositing a passivation layer on said patterned second metal layer and said gate insulating layer;

patterning said passivation layer to form an opening over said etch stop portion and a contact hole over part of said patterned second metal layer;

depositing a transparent conductive layer on said patterned passivation layer and in said contact hole;

patterning said transparent conductive layer to form a pixel electrode electrically connected to said part of said patterned second metal layer; and etching said second metal layer and said second impurity containing semiconductor layer in a single processing step using said patterned passivation layer as a mask to thereby form source and drain electrodes.

17. A method for manufacturing a semiconductor device comprising the steps of:

depositing a first semiconductor layer on a substrate;

depositing a second semiconductor layer on said first semiconductor layer;

depositing a conductive layer on said second semiconductor layer;

depositing a passivation layer on said conductive layer;

patterning said passivation layer to provide a plurality of openings exposing said conductive layer; and etching portions of said conductive layer and said second semiconductor layer in a single processing step using said patterned passivation layer as a mask, whereby an etch stop portion is exposed through one of the plurality of openings.

* * * * *